United States Patent [19]
Gagon

[11] Patent Number: 5,736,897
[45] Date of Patent: Apr. 7, 1998

[54] LOW INPUT SIGNAL BANDWIDTH COMPRESSOR AND AMPLIFIER CONTROL CIRCUIT WITH A STATE VARIABLE PRE-AMPLIFIER

[75] Inventor: Paul R. Gagon, Garden Grove, Calif.

[73] Assignee: BBE Sound Inc., Huntington Beach, Calif.

[21] Appl. No.: 636,168

[22] Filed: Apr. 22, 1996

Related U.S. Application Data

[63] Continuation-in-part of Ser. No. 377,903, Jan. 24, 1995, Pat. No. 5,510,752.
[51] Int. Cl.$^6$ .................................. H03F 3/68; H03G 7/00
[52] U.S. Cl. .................................. 330/126; 381/106
[58] Field of Search .................................. 330/59, 126, 149, 330/306; 333/14; 381/106, 120

[56] References Cited

U.S. PATENT DOCUMENTS

| | | | |
|---|---|---|---|
| 3,714,462 | 1/1973 | Blackmer | 307/279 |
| 3,789,143 | 1/1974 | Blackmer | 179/155 R |
| 4,097,767 | 6/1978 | Blackmer | 307/229 |
| 4,293,821 | 10/1981 | Boudouris et al. | 330/126 |
| 4,327,331 | 4/1982 | Yoshimi et al. | 330/126 |
| 4,403,199 | 9/1983 | Blackmer | 330/278 |
| 4,409,500 | 10/1983 | Welland | 307/490 |
| 4,438,414 | 3/1984 | Blachot | 330/126 X |
| 4,482,866 | 11/1984 | Crooks | 330/149 |
| 4,484,345 | 11/1984 | Sterns | 381/98 |
| 4,638,258 | 1/1987 | Crooks | 330/149 |
| 4,661,851 | 4/1987 | Mutersbaugh | 358/144 |
| 4,922,131 | 5/1990 | Anderson et al. | 307/355 |
| 4,926,139 | 5/1990 | Anderson et al. | 330/294 |
| 4,934,770 | 6/1990 | Anderson et al. | 330/278 |
| 5,510,752 | 4/1996 | Gagon | 330/126 |

OTHER PUBLICATIONS

Model 563X Hiss Reducer dbx Service Manual Including A Schematic 563X Main Led Board, 340654 Dated Nov. 5, 1987.

*Primary Examiner*—Steven Mottola
*Attorney, Agent, or Firm*—Foley & Lardner

[57] ABSTRACT

A state-variable pre-amplifier responsive to a program input signal drives a filter circuit, and an absolute value circuit. The state-variable pre-amplifier uses a state-variable filter to provide a compensated signal at an output. The compensated signal has compensated high, low and mid-range frequency signal components. The pre-amplifier has a first amplifier stage for providing a high frequency compensated signal. A second amplifier stage provides a mid-range frequency compensated signal. A third amplifier stage provides a low range frequency compensated signal. An adjusting means adjusts the balance between at least two of the three frequency compensated signals. A summing circuit adds the three compensated signals to form the compensated signal. A balance means adjusts the balance between the high frequency, the mid-range and the low frequency compensated signals to provide a compensated signal. The filter circuit is coupled to receive and automatically filter the compensated signal to provide an output signal and a modified compensated signal. The filter circuit has an adjustable bandwidth that is automatically adjusted in response to the control signal for automatically reducing the bandwidth of the filter circuit in response to lower values of the control signal to obtain the output signal. The filter circuit uses a voltage controlled amplifier or a photo cell in combination with an integrator. An absolute value circuit senses the modified compensated signal and provides a control signal proportional to the average peak value of the amplitude of the modified compensated signal.

19 Claims, 5 Drawing Sheets

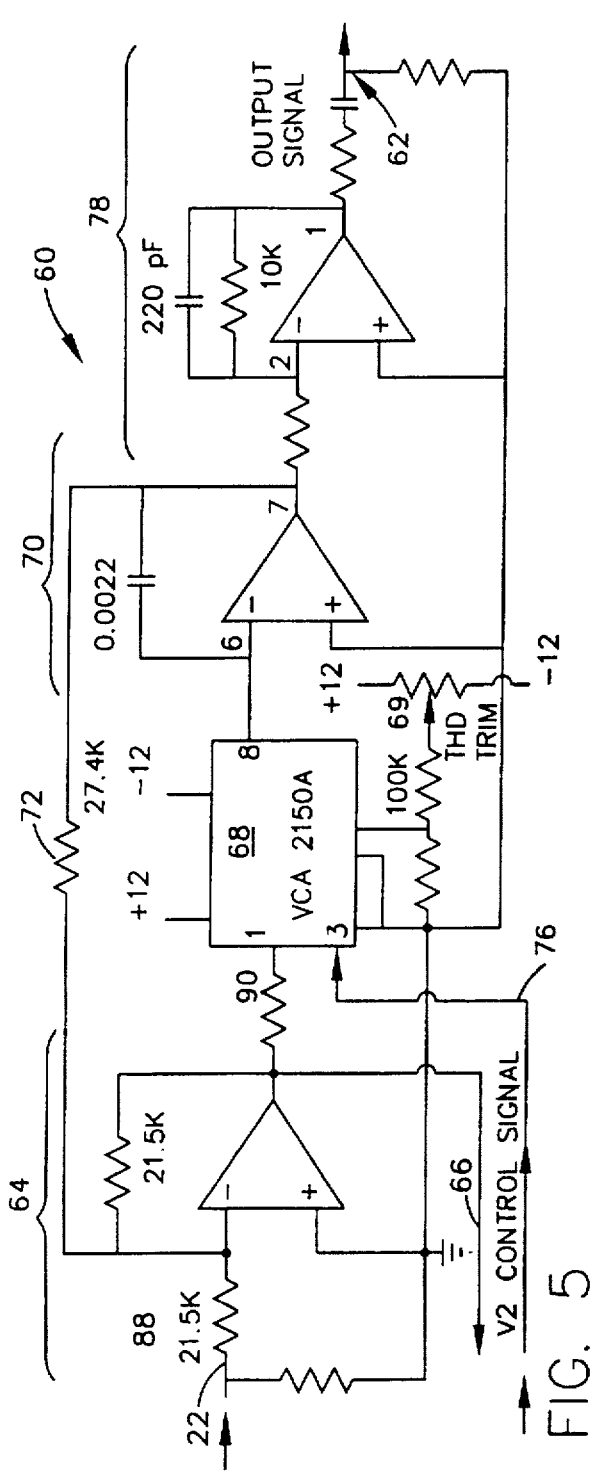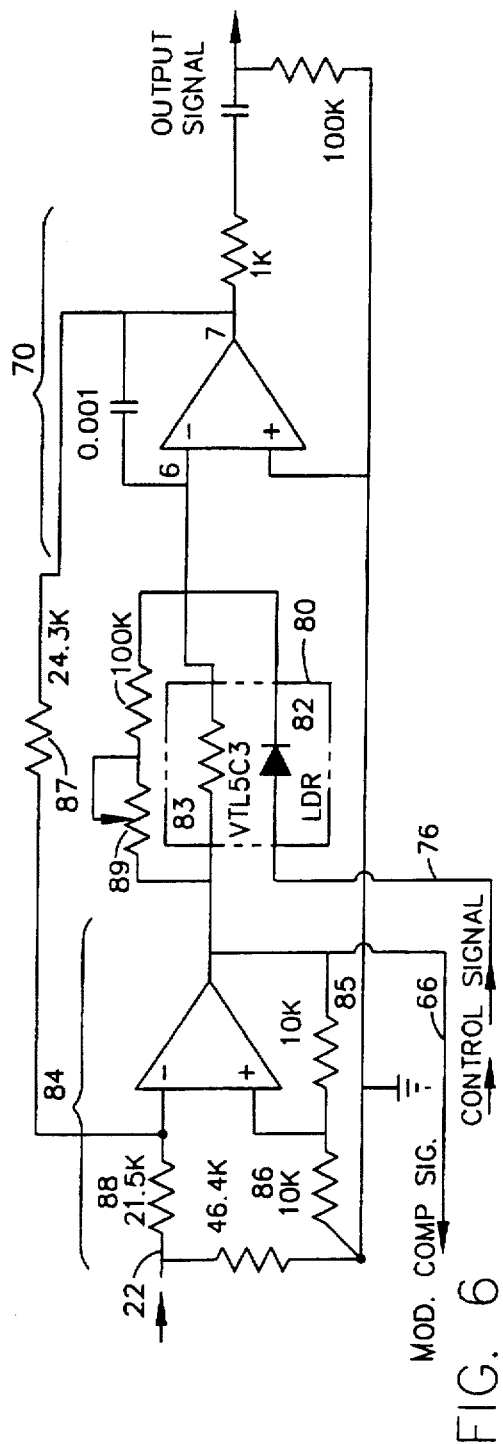

LOW INPUT SIGNAL BANDWIDTH COMPRESSOR AND AMPLIFIER CONTROL CIRCUIT WITH A STATE VARIABLE PRE-AMPLIFIER

This application is a continuation-in-part application to S/N 08/377,903 filed Jan. 24, 1995 for "A LOW INPUT SIGNAL BANDWIDTH COMPRESSOR AND AMPLIFIER CONTROL CIRCUIT" which issued on Apr. 23, 1996 as U.S. Pat. No. 5,510,752 and which has a common inventor and assignee.

BACKGROUND OF THE INVENTION

1. Field of the Invention

This invention relates to the field of electronics amplifiers and more particularly to the field of signal conditioning circuits for signal compression and expansion such as those used in audio entertainment systems.

As an example of signal compression, the magnetic tape on a tape deck might have a dynamic range of only about 60 dB. A signal source might be supplying the tape with a signal that has a dynamic range of about 80 dB. If the signal level of the source material is adjusted such that the largest signals are not clipped, the resulting recording would have passages that are very soft and possibly inaudible when reproduced. To hear the softer passages when replayed at a later time, the output level would have to be increased to a level that might begin to reproduce the noise floor of the recording media on the tape.

A compressor circuit is sometimes used to compress the 80 dB source signal range into about 40 dB by attenuating the larger amplitude signals and not the lower amplitude signals. The signal source output signal amplitude is then adjusted to place the topmost value of the 40 dB signal range out of the signal source at a level that matches the top value of the 60 dB signal range of the tape in the recorder. The signal range on the tape is thereby positioned at levels between the top limit of the dynamic range of the tape, absent clipping, down 40 dB leaving a remaining 20 dB of signal dynamic range that contains noise but which is largely absent signal information.

The large amplitude low frequency signals are compressed in amplitude along with bursts or instantaneous transients that are typically high frequency information. A compressor appears to function to attenuate only the larger amplitude signals leaving the lower amplitude signals unaffected. The larger the range of change, the larger the attenuation.

The parent application of this continuation-in-part application taught a multichannel pre-amplifier with automatic balancing on the mid-range and high frequency channels. The pre-amp output signal was then subjected to automated bandwidth expansion and compression as a function of pre-amp output signal amplitude. The invention of this application uses a state-variable band-pass active filter as a pre-amplifier for the purpose of reducing the parts count. The invention therefore functions as a simplified compander in providing the features of both a compressor and an expander in combination with a state-variable band-pass active filter acting as a pre-amplifier.

2. Description of Related Art

U.S. Pat. No. 3,789,143 issued Jan. 29, 1974 to D. E. Blackmeer teaches a "Compander With Control Signal Logarithmically Related To The Instantaneous RMS Value Of The Input Signal that shows a circuit in which the gain control is derived proportional to the RMS value of the audio signal that is received at its input. This circuit topology does not appear to contain a bandwidth sensitive feature that reduces the bandwidth of the amplifier in response to receiving signals of lower amplitude nor does it show the circuit in combination with appropriate pre-amplification characterized to provide an automatic balance between the amplitude of the mid-range and high frequency ranges of signals being processed by the pre-amplifier.

U.S. Pat. No. 4,482,866 issued on Nov. 13, 1984 for a Reference Load Amplifier Correction System, and U.S. Pat. No. 4,638,258 issued on Jan. 20, 1987 for a Reference Load Amplifier Correction System, both issuing to Robert C. Crooks. Both of these patents have a common assignee Barcus-Berry Electronics, Inc. of Huntington Beach, Calif. now owned by BBE Sound, also of Huntington Beach, Calif., the assignee of this application. The '866' patent and the '258' patent show circuit topologies that can be used as the pre-amplifier section of the claimed combination invention; however, the circuit topologies of FIGS. 8 and 9 in the '258' patent have been the preferred topologies. None of the aforementioned references show or teach the claimed elements of a filter channel or the absolute value circuit in combination with a simplified state-variable band-pass active filter acting as a pre-amplifier.

SUMMARY OF INVENTION

A first object of the invention is to provide an amplifier circuit that combines a state-variable band-pass filter acting as a pre-amplifier that provides the function of a three channel preamplifier having a low pass channel, a high pass channel and an inverting mid-range channel. The state-variable pre-amplifier provides a compensated signal to a filter circuit that provides a modified composite signal to a second channel comprising an absolute value circuit. The second channel is an absolute value circuit that responds to the modified compensated signal and provides a control signal proportional to the amplitude of the modified compensated signal to the filter circuit which then supplies an output signal to a power amplifier.

A second objectives of the state-variable filter is to set phase shift and gains up such that the mid-range band-pass frequency signals are about 180 degrees out of phase with the signal components in the lower frequency band and in the higher frequency band.

It is a third object of the invention to provide an embodiment of the filter circuit that has an input amplifier for summing the compensated signal and an integrator output signal and that provides the modified compensated signal to the input of the absolute value circuit and to the input of a voltage controlled amplifier. The voltage control amplifier has a second input coupled to receive the control voltage. The voltage control amplifier provides an integrator input signal current to the input of an integrator circuit.

It is a fourth object of the invention to provide an embodiment of the absolute value circuit that has a high band-pass amplifier coupled to receive the modified compensated signal from the filter circuit. The high band-pass amplifier amplifies the modified compensated signal and couples its output, a first amplified signal, to the input of an absolute value rectifier circuit. The absolute value rectifier circuit rectifies the first amplified signal and provides an absolute value signal. A peak detection circuit receives the absolute value signal and provides a peaked absolute value signal. A low-pass filter and bias circuit receives the peak absolute value signal and provides the control signal to the filter channel. The low-pass filter and bias circuit has a dc bias adjustment control for adding a dc bias level to the control signal.

The integrator circuit integrates the integrator input signal current and provides an integrator output signal. A low-pass active filter receives the integrator output signal and filters it to provide the output signal.

In an alternative embodiment of the filter circuit, the input amplifier for summing the compensated signal and the integrator output signal provides the modified compensated signal to a photocell that has a photosensitive resistor and a light emitting diode driven by the control signal from the output of the absolute value circuit. The photosensitive resistor responds to light from the light emitting diode to modify the modified compensated signal to be an integrator input signal. The photosensitive resistor couples the integrator input signal to the integrator input.

BRIEF DESCRIPTION OF THE DRAWINGS

FIG. 5 is a schematic of a first embodiment of a single stage filter circuit responsive to a compensated signal from the pre-amplifier, the single stage filter circuit using a solid state voltage controlled amplifier responsive to a control signal for low frequency signal amplitude compression;

FIG. 6 is a schematic of an alternative embodiment of a single stage filter circuit using a photocell for ultra low noise and distortion and for low frequency signal amplitude compression; and, FIG. 7 is a schematic of an absolute value circuit for continuously monitoring the amplitude of the modified compensated signal to provide a control signal representative of the time dependent peak average value of the modified compensated signal, to the filter circuit for continuous adjustment and control of the bandwidth of the filter circuit.

PREFERRED EMBODIMENT

Figure 1:
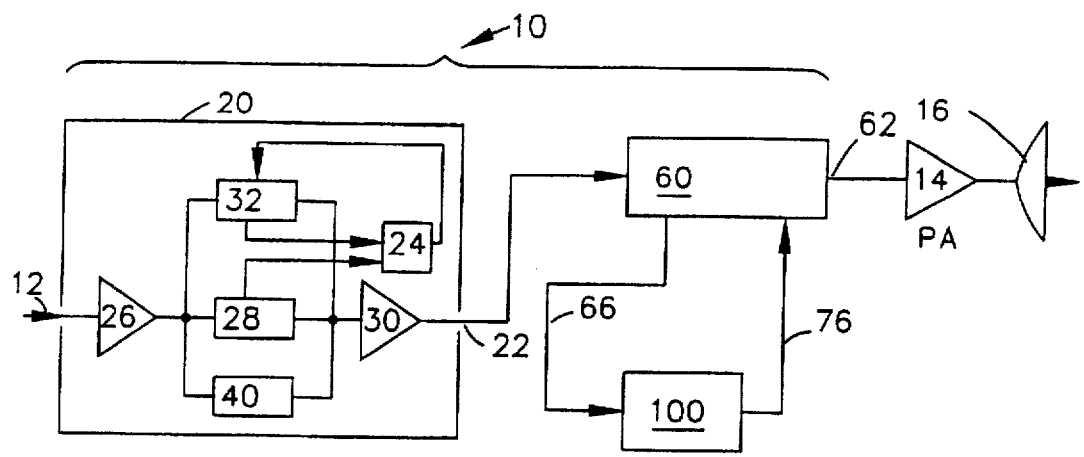
FIG. 1. is a block diagram of the amplifier circuit of the parent application showing a three channel pre-amplifier with automatic gain control circuitry for balancing the high and mid-range signal components, in combination with the filter circuit and the absolute value circuit.

FIG. 1 is a block diagram of the amplifier circuit 10 of the parent patent application, issued as U.S. Pat. No. 5,510,752 on Apr. 23, 1996. Amplifier circuit 10 is shown coupled to receive a program input signal at input terminal 12 such as the low level audio signal from a tape recorder or tape deck or a composite analog signal after a digital-to-analog conversion from a digital signal source (not shown). The amplifier 10 is typically used to provide a conditioned output signal to a power amplifier 14 which provides a drive signal to a speaker 16.

Amplifier circuit 10 of the parent application comprises a three channel pre-amplifier 20, a filter circuit 60 and an absolute value circuit 100, the individual functions and features of which will now be explained as background in connection with the block diagram of FIGS. 1 and 3 and the detailed schematics of FIGS. 2 and 4–7. FIG. 1 shows that pre-amplifier 20 comprises a three channel pre-amplifier responsive to the program input signal at terminal 12. The program input signal is typically a continuously varying composite signal having high, low and mid-range frequency signal components in the 30 Hz to 20 Khz range. As background, the pre-amplifier 20, of the parent application is shown in greater detail in the schematic of FIG. 2.

Figure 3:
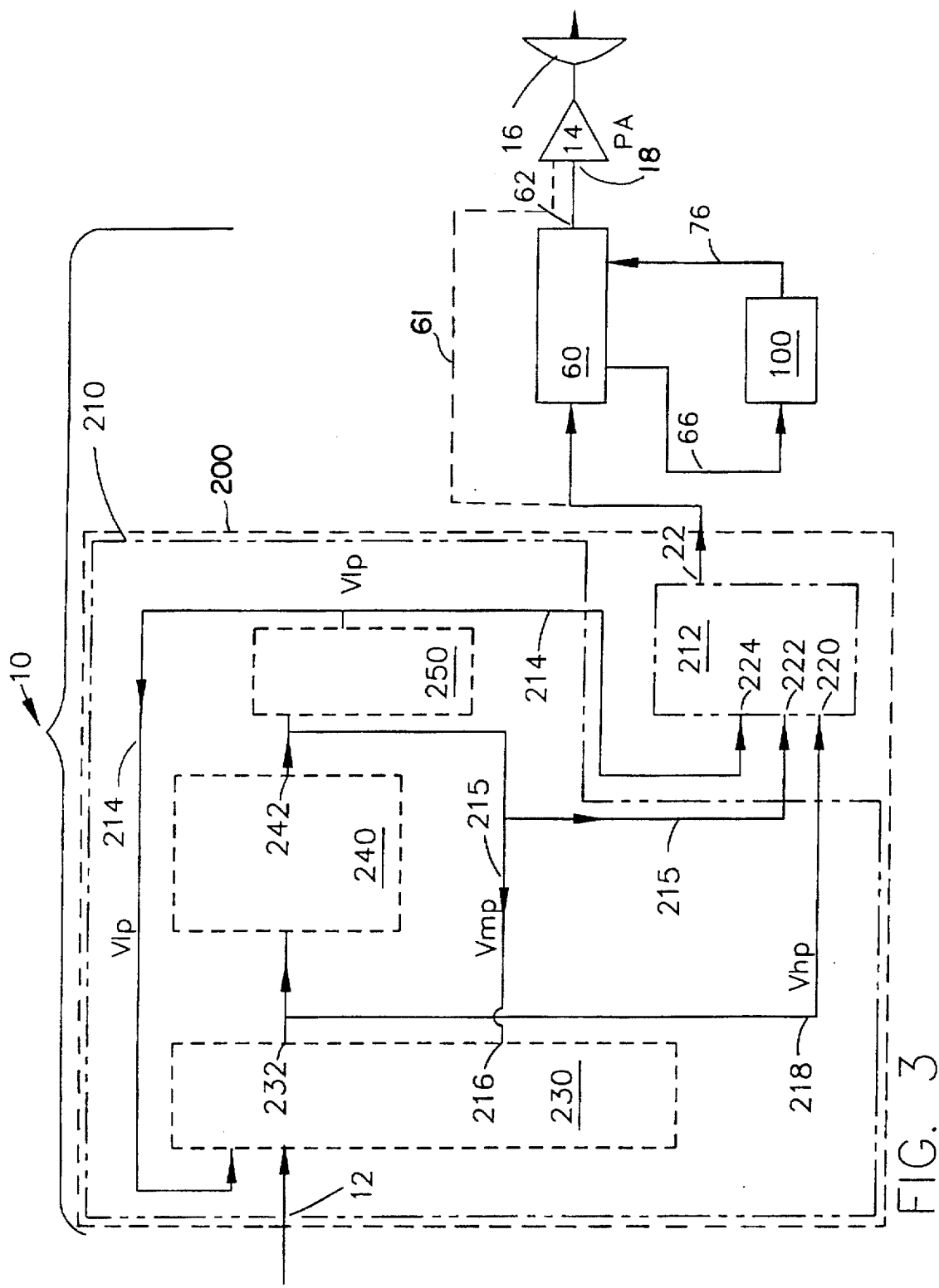
FIG. 3 is a modified block diagram of FIG. 1 in which the block diagram of the state-variable pre-amplifier is depicted within phantom blocks 210 and 212 as a substitute for the three channel pre-amplifier 20 shown in FIG. 1.

Referring to FIG. 3, the preferred embodiment of the present invention substitutes a state-variable pre-amplifier shown within phantom block 200, that comprises in combination, a state-variable filter circuit, shown within phantom block 210, in combination with a summing amplifier, shown within phantom block 212, for the three channel pre-amplifier 20 used in the parent application. FIG. 3 illustrates the substitution in detail. The substitution of the state-variable pre-amplifier 200 for the three channel pre-amplifier 20 results in a reduction in the component count from that used in the parent's three channel pre-amplifier 20 while matching the bandwidth gain and phase characteristics of the three channel pre-amplifier 20.

Figure 4:
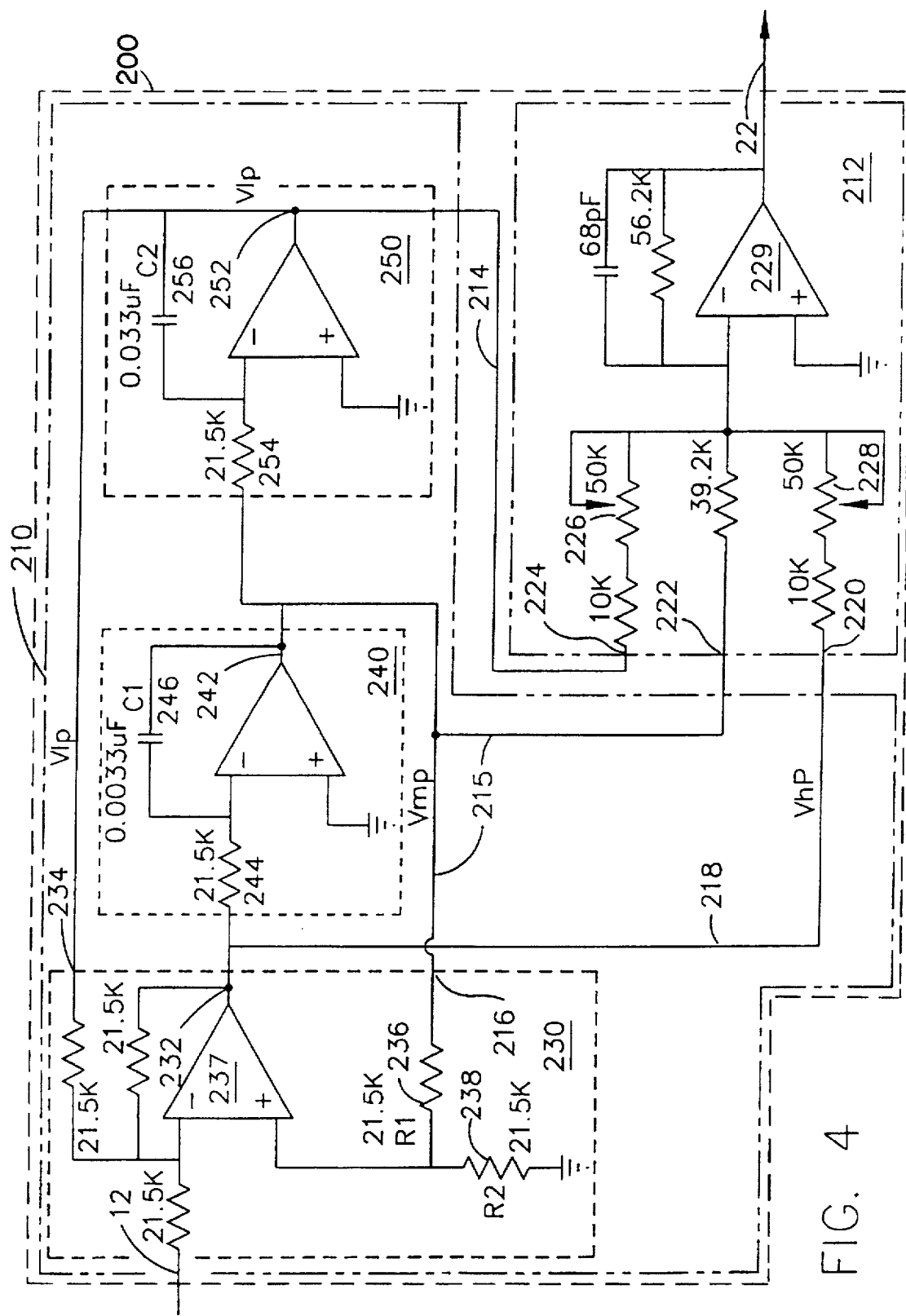
FIG. 4 is a schematic of a state-variable pre-amplifier comprising a state-variable filter and a summing amplifier with manual gain control circuitry for adjusting the high and low pass signal components.

FIG. 4 provides a detailed schematic of the state-variable pre-amplifier 200, the state-variable filter circuit 210 and the summing amplifier 212 of FIG. 3. The pre-amplifier 20 of the parent application and the state-variable pre-amplifier 200 of the present invention each provide a compensated signal at the pre-amplifier output terminal 22.

Figure 2:
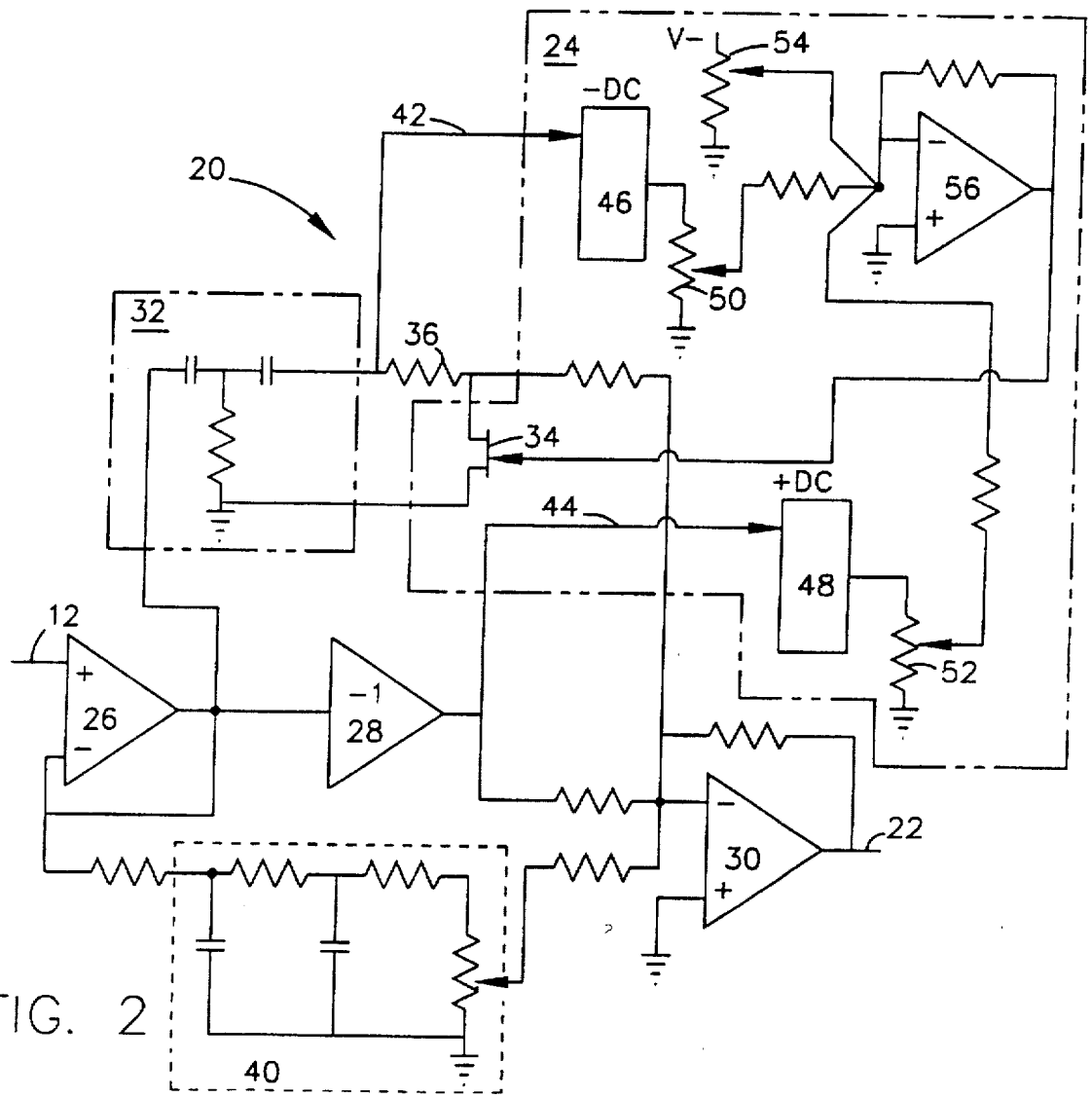
FIG. 2 is a detailed schematic from the parent application showing the three channel pre-amplifier with automatic gain control circuitry for balancing the high and mid-range signal components.

The pre-amplifier 20 of FIGS. 1 and 2 has automatic gain control circuitry represented by block 24 in FIG. 1 is shown in substantial detail within phantom block 24 in FIG. 2. Features of the automatic gain control circuitry and the advantages of this control feature are explained in U.S. Pat. No. 4,482,866 at column 23, line 30 and those lines and columns subsequent.

U.S. Pat. No. 4,482,866 issued on Nov. 13, 1984 for a Reference Load Amplifier Correction System, and U.S. Pat. No. 4,638,258 issued on Jan. 20, 1987 for a Reference Load Amplifier Correction System are incorporated herein by reference in their entirety along with the contents of the parent patent having S/N 08/377,903 filed Jan. 24, 1995 for "A LOW INPUT SIGNAL BANDWIDTH COMPRESSOR AND AMPLIFIER CONTROL CIRCUIT" which issued on Apr. 23, 1996 as U.S. Pat. No. 5,510,752 and which has a common inventor and assignee.

Referring to FIG. 2, the three channel pre-amplifier input amplifier 26 provides impedance matching and buffering to and from the input source. The inverting amplifier 28, is shown as having unity gain, receives the buffered input signal from the output of the input amplifier 26 and provides an inverted mid-range signal to an input of summing amplifier 30.

The input amplifier 26 also provides the buffered input signal to a high pass channel represented by the high pass passive filter circuitry within phantom block 32. The output of the high pass filter provides its output to the divider formed by resistor 36 and by J-FET 34, the gate of the J-FET being controlled by the automatic gain control circuitry represented by block 24. The automatic gain control circuitry balances the high frequency signal components in the 2,500–20,000 range processed by the circuitry of phantom block 32 with the mid-range frequency components in the 200–2,500 range being output by inverting amplifier 28. Phantom block 40 contains a two pole passive network comprising a the low pass channel for processing signal components in the 30–200 Hz range. The automatic gain control circuitry within phantom block 24 senses the high frequency signal components on signal line 42 from the output of the high frequency channel and the mid-range signal components via signal line 44 from the output of the mid-range inverting amplifier 28.

The high frequency channel signal components are delivered to a negative output absolute circuit 46 that provides a negative going output control signal for increasing amplitudes of the sampled high frequency signal components. The mid-range channel mid-range signal components are delivered to a positive output absolute circuit 48 that provides a positive going output control signal for increasing amplitudes of the sampled mid-range frequency signal components.

The negative going output control signal is adjusted by divider 50; the positive going output control signal is adjusted by divider 52 and the combined control signals are balanced by balance adjustment 54 as they are summed by control summing amplifier 56 to provide a gate control signal to the gate of J-FET 34 to reduce or increase the amplitude of the high frequency channel signal components to keep them in balance with the amplitude of the mid-range channel frequency components. Pre-amplifier summing amplifier 30 sums the balanced high and mid-range frequency signal components with the low frequency signal components to provide the compensated signal at terminal 22.

In contrast to the circuit of FIGS. 1 and 2, FIG. 3 shows the preferred embodiment of amplifier 10 using the state-variable pre-amplifier within phantom box 200. A reduction in parts count and complexity over the three channel embodiment of FIG. 2 is apparent.

Referring to FIGS. 3, and 4, the state-variable filter, within phantom block, 210 processes the program input signal at terminal 12 to provide three band-pass signals comprising a low band-pass signal Vlp (a low-range compensated signal) on signal line 214, a mid-range bandpass signal Vmp (a mid-range compensated signal) on signal line 215 and a high range bandpass signal, Vhp (a high frequency compensated signal) on signal line 218 to respective inputs of a summing amplifier 212.

The summing amplifier 212 uses operational amplifier 229 and sums the respective Vlp, Vmp and Vhp signals at the low pass input 224, the mid-range input 222 and the high pass input 220, and provides the compensated signal at output terminal 22 to the filter circuit 60 shown in FIGS. 1 and 3 or directly to a power amplifier means such as power amplifier 14 to drive speaker 16. FIG. 3 shows an alternative embodiment in which the compensated signal at pre-amplifier output terminal 22 is coupled directly to the input 18 of power amplifier 14 via circuit path 61.

The combination of the state-variable filter 210 and the summing amplifier 212 thereby form a functional and lower cost equivalent of the alternative embodiment three channel pre-amplifier of FIGS. 1 and 2. The summing amplifier 212 provides a function similar to that of summing amplifier 30 in FIGS. 1 and 2.

Referring again to FIGS. 3 and 4, phantom block 230 represents an input summing and damping amplifier circuit. The program input signal at terminal 12 and the low bandpass signal Vlp on signal line 214 are fed to the inverting input of amplifier 237. A portion of the mid-range band-pass signal Vmp is fed to the non-inverting input of amplifier 237 for damping. The resulting output of amplifier 237, the high range band-pass signal Vhp is fed to the negative input of a second amplifier within block 240, a first integrator shown within phantom block 240, for inversion and integration and to the summing amplifier high pass input 220 on signal line 218.

The first integrator 240 integrates the Vhp signal to provide the mid-range band-pass signal Vmp at first integrator output 242. The mid-range bandpass signal Vmp is fed to the damping input 216 of the input summing and damping amplifier circuit 230 and to the mid-range summing amplifier mid-range band-pass input 222 on signal line 215 and to the negative input of a third amplifier within block 250.

Phantom block 250 represents a second integrator that responds to the mid-range bandpass signal Vmp on signal line 215 and provides a low bandpass signal Vlp at the second integrator output terminal 252 to the summing amplifier low band-pass signal input 224 via signal line 214. The low bandpass signal Vlp is also fed to a second input 234 of the input summing and damping amplifier circuit 230.

The damping circuit of the input summing amplifier 230 comprises an input resistor 236 that has a first terminal connected to receive the mid-range bandpass signal at damping input 216. The second terminal of resistor 236 is coupled to the first terminal of resistor 238 and to the non-inverting input of operational amplifier 237. The second terminal of resistor 238 is coupled to a reference ground. The ratio of resistors 236 and 238 establish the "Q" of the state-variable filter. The higher the gain, of the ratio of the resistors 266 and 238, the higher the Q. The Q of the state-variable filter of FIGS. 3 and 4 is typically in the range of 0.5 to 2 for audio applications. The Q of the circuit of FIG. 4 is approximately 0.67.

One of the objectives of the state-variable filter is to set phase shift and gains up such that the mid-range band-pass frequency signals are about 180 degrees out of phase with the signal components in the lower frequency band and in the higher frequency band. The ratio of the damping resistors, the gains and break frequencies of the amplifiers and integrator are set for a desired Q and bandpass.

In addition, the summing amplifier 212 has a low frequency band-pass gain adjustment pot 226, and a high range bandpass frequency gain adjustment pot 228 that permit the user to make a final adjustment for a particular circuit and component configuration. The adjustable inputs to the summing amplifier 212 permit the user to obtain additional gain for the Vhp and Vlp signal.

The circuit of FIGS. 3 and 4 can be adjusted to obtain a total of 360 degrees of phase shift of the high frequency signal components of the input program signal with respect to the low frequency signal components of the input program signal, in frequency space over the range of 0–20,000 Hz. The high frequency components gain 360 degrees with respect to the lows.

The state-variable pre-amplifier also provides a time delay that is adjusted to obtain about 2.5 ms time delay at 20 Hz. The 20 Hz components are physically delayed in real time by up to 2.5 ms with respect to the High Frequency components. The design objectives for audio applications are taught in U.S. Pat. No. 4,638,258 issued on Jan. 20, 1987 for a Reference Load Amplifier Correction System, to Robert C. Crooks.

Referring again to FIG. 4, a reactance chart check will show the break frequency for the mid-range bandpass amplifier 240 to be about 2.24 KHz. The break frequency for the low range bandpass amplifier 250 is about decade lower at 224 Hz at three dB per octave. The Q of the circuit of FIG. 4 is approximated by the following equation:

$$Q=(R1+R2)/3R2=0.67$$

where R1 is resistor 236 and R2 is resistor 238.

Viewing the circuit heuristically, the higher reactance of the smaller cap for mid-range bandpass amplifier 240 clearly sets the gain of the amplifier to higher values at lower frequencies than that of the low range band-pass amplifier 250. It can also be seen that the mid-range band-pass amplifier is a single pole filter. The feed back signal Vmp to the damping resistors results in a controlled Q in the mid-range frequencies band.

In general, the Q of a band-pass filter is defined as the bandwidth divided by the center frequency. The design of the state-variable filter of FIG. 4 is taught in the text "The Active Filter Handbook" by Frank P. Tedeschi, pg 178–182, Tab Books Inc of Blue Ridge Summit, Pa., 17214; however, this reference does not show the outputs being summed to form the desired unbalanced output that meets the desired requirement for audio applications.

The object of the design of FIG. 4 is to have a first break frequency at approximately 240 Hz and a second at 2.24 KHz, about a decade away from the first break. The low break $f_c$ is established by the equation:

$$f_c = 1/2\pi RC2$$

where R and C are the value of resistor 254 and capacitor 256. The high frequency break is set by the $$f_c = 1/2\pi RC1$$

where the value of R and $c_1$ are those of resistor 244 and capacitor 246.

Once the Q is selected, the ratio of R1 to R2 can be calculated from the equation. In the case of FIG. 4, a Q of 0.67 was selected by knowing what the desired gain bandwidth response curve would be from the above referenced U.S. Pat. No. 4,638,258. The circuit was modeled using a computer aided analysis program such as SPICE. The break frequencies were estimated from the information in the referenced U.S. Pat. No. 4,638,258. Initial component values were selected based on available components. A reactance chart can be used for a quick approximation of the required remaining value once one of the values are known. The circuit shown had an initial goal of a design a center frequency at 700 Hz. At the center frequency, the gain of the circuit is about −1 dB or less than 1. The two adjustment pots, 226 and 228 permit an adjustment of the gain of the Vlp and the Vhp by about 15 dB with the values shown.

The Q was then adjusted using the pots 226 and 228 to provide the best match to the curves in the earlier patent to Crook. The Q and the break points were selected to match the response characteristic of the resulting circuit to the curves in the earlier patent to yield the same phase shifts, time delays and frequency response. The resistors 226 and 228 are set for a gain of nine but a slightly higher gain of 12 would be preferred.

The outputs Vhp, Vmp and Vlp of the state-variable filer represent three independent state variables. Summing the three unbalanced outputs to obtain a compensated signal is believed to be a novel step when combined with processing by the filter circuit 60 and the absolute value circuit 100 of FIG. 3.

The procedure for adjusting the band-pass and gain as proposed in the above referenced text "The Active Filter Handbook" by Frank P. Tedeschi, at pages 178–182" is to set the value of C1 and C2 to be equal and to adjust the ratio of R1 and R2 and to obtain the desired Q. In the circuit of FIG. 4, the summing amplifier gain controls for the Vhp and Vlp signals provide for independent control of the gain and band-pass.

FILTER CIRCUIT AND ABSOLUTE VALUE CIRCUIT

FIG. 5 shows a preferred embodiment of the filter circuit 60 using a voltage controlled amplifier 68. The filter circuit is coupled to receive and automatically filter the compensated signal at terminal 22 to provide an output signal at terminal 62. A modified compensated signal is provided by filter input amplifier 64 on signal line 66 to the input of absolute value circuit 100 shown in FIG. 7.

The output impedance of the filter input amplifier 64 is sufficiently low that it is able to also provide the modified compensated signal to the input of voltage controlled amplifier 68. The filter input amplifier 64 also receives a feedback signal from the output of integrator 70 via input resistor 72. It should be understood that the feedback signal from the integrator vary slowly in comparison with the compensated signal at terminal 22. Therefore, the modified compensated signal necessary for the absolute value channel could be obtained from a separate filter input amplifier (not shown) at the input of the absolute value circuit, the added filter input amplifier circuit being coupled to receive the compensated signal directly from terminal 22.

If a separate filter input amplifier (not shown) were to be used, the feedback control signal from resistor 72 would probably be omitted. If the separate filter input amplifier were to be used, FIG. 1 would be modified to use the signal path of phantom line 74 while deleting the signal path of signal line 66.

However, the topology shown in FIG. 5 is believed to be preferred since it operates satisfactorily and requires one less amplifier the alternative arrangement being a design alternative.

In the embodiment of FIG. 5, the voltage controlled amplifier 68 is typically a 2150A voltage controlled amplifier obtained from the THAT Corporation, dbx OEM Products at 15 Strathmore Road, Natick, Mass., 01760. The 2150A performs a compander function in combination with another circuit capable of controlling the compression. The 2150A requires other circuitry to achieve the expander function. The 2150A simply controls the feed signal into the integrator circuit 70.

The THD TRIM adjustment (total harmonic distortion), variable resistor 69 is used to trim the current values of two internal current sources within the U2 VCA 2150A. This adjustment is a factory adjustment which typically requires the use a harmonic distortion analyzer. By adjusting the THD TRIM, values of harmonic distortion as low as 0.02 have been obtained with the circuit of FIG. 5.

The circuitry from the filter input amplifier 64 to the output of the integrator 70 comprises a simple first order filter. The filter has a break frequency that is able to move and that is controlled by the control signal into pin 3 of the VCA 2150A 68. The break frequency is effectively controlled by the effective resistance of the voltage controlled amplifier 68 which operates to establish a controlled resistance between pins 1 and 8.

The filter circuit 60 is responsive to the control signal for automatically adjusting the bandwidth of the filter circuit to reduce the bandwidth of the filter circuit in response to reduced amplitude values of the control signal on signal line 76. The automatically adjustable bandwidth of filter circuit 60 is responsive to the control signal on signal line 76 from the absolute value circuit 100 for automatically reducing the bandwidth of the filter circuit in response to reduced values of the control signal to obtain the output signal at terminal 62. Output amplifier 78 buffers and scales the integrator output signal and provides the output signal at terminal 62.

FIG. 6 show an alternative embodiment of the filter circuit 60 that substitutes a photocell 80 for the solid state voltage controlled amplifier 68 shown in FIG. 5. The alternative embodiment of FIG. 6 has the advantage of lower noise and distortion over the performance of the circuit of FIG. 5 but presently, at the cost of greater power required to drive the LED 82 and the larger volume of the photocell component 80.

In the embodiment of FIG. 6, the photocell 80 is a light dependent resistor 83 responsive to light from the LED 82. The LED is driven by current into its anode. The adjustable resistor 89 is an adjustment that is used in dual channel systems to balance the two channels because the photocells are not that well matched.

The overall gain is set to be approximately one by the ratio of feedback resistor 87 over input resistor 88. The gain through the non inverting first stage is approximately two. That gain is established by the ratio of (R86+R85)/R86. Some losses accrue to the integrator with the result that the overall gain is unity.

As current is increased through the diode, its brightness is increased which reduces the resistance of the photoresistor 83. The relationship between the current and resistance is not linear. The use of the photocell reduces the number of elements that the signal passes through thereby reducing the noise on the signal.

A complex solid state voltage controlled amplifier such as the 2150A has numerous diodes, and potentially non-linear components likely to increase the noise on the signal. Use of the photocell is believed to result in a 15–20 dB reduction in noise over that possible with a voltage controlled amplifier. The function of the filter input amplifier 64 of FIG. 5 is performed by the filter input amplifier 84 of FIG. 6. Filter input amplifier 84 provides an added non-inverting feed back network of divider resistors 85 and 86 that provide a gain of +2 to the compensated signal at input terminal 22. The overall gain of the circuit of FIG. 6 is approximately unity as in the case of the circuit of FIG. 5, each being controlled by the ratio of a feed back resistor and an input resistor such as resistors 87 and 88 respectively. The break frequency of the integrator 70 is controlled by the value of its feedback capacitor and the equivalent resistance between the output of the filter input amplifier 84 and pin 6 of the integrator amplifier.

In the case of the solid state voltage controlled amplifier 68 of FIG. 5, the device is specified to output a current into the virtual ground of pin 6 of the integrator amplifier. The current is a dependent variable of the current into pin 1 of the voltage controlled amplifier 68 and the control signal voltage on signal line 76. The current into pin 1 of the voltage controlled amplifier is a function of the output voltage V1 of the filter input amplifier 64 and resistor Rin 90. The net result would be expressed approximately as Iin=V1/Rin. Therefore V1=Rin*Iin. Also, the current out of the voltage controlled amplifier, Io=K1*Iin*V2 where V2 is the value of the control voltage and K1 is the gain of the voltage controlled amplifier. V1/Io is a ratio that is representative of a resistor between the output of the filter input amplifier 64 and the virtual ground of pin 6. Substituting Iin*Rin/K1*Iin*V2=Rin/K1*V2=(1/V2)*Rin/K1=the resistance between the output of the filter input amplifier and the input the integrator at pin 6. The relationship shows that the resistance is reduced by increasing values of control voltage V2 on signal line 76.

The photocell has a similar property in that increasing values of light from the LED 82 will reduce the value of the light sensitive or photosensitive resistor 83.

Figure 7:
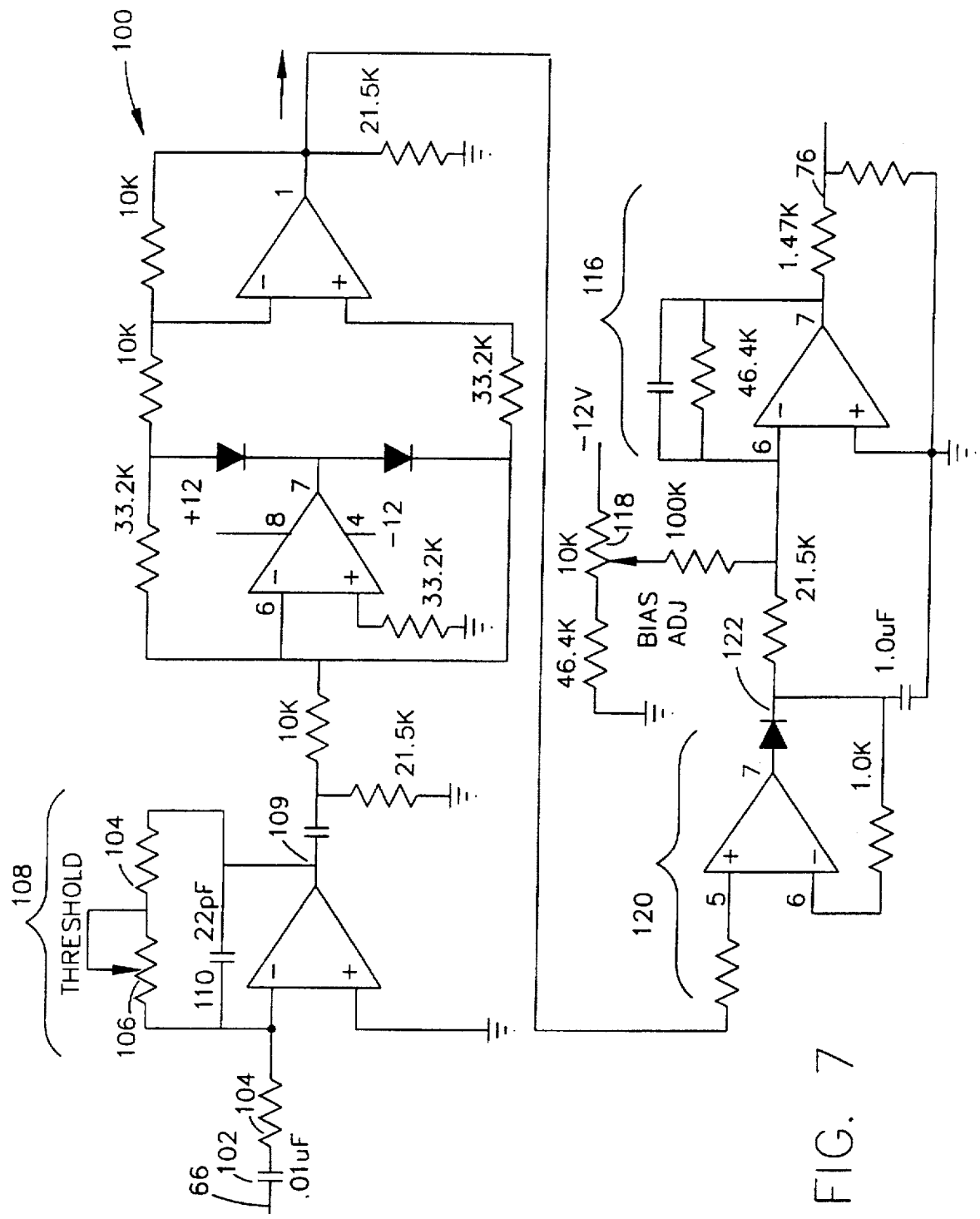

FIG. 7 shows the absolute value circuit 100 responsive to the modified compensated signal on signal line 66 for providing a control signal on signal line 76 that is proportional 76 to the amplitude of the modified compensated signal. The absolute value circuit 100 has an input dc isolation and lead network comprising capacitor 102 and resistor 104. Most of the filtering breakpoints, such as those established by capacitor 102 and resistor 104 combination were established by empirical experiments so as to find values that sounded best.

The THRESHOLD control, variable resistor 106 on the absolute value circuit input amplifier 108 is adjusted to accommodate an input signal that is low in amplitude and high in frequency. The absolute value circuit input amplifier is a high pass amplifier that is coupled to receive the modified compensated signal from signal line 66 and that provides a first amplified signal at its output terminal 109. The THRESHOLD control adjustment of variable resistor 106 is a compromise that is made by the user to obtain the high frequency information along with some hiss or noise. The input capacitor 102 and resistor 104 are dominant for reducing the gain at low frequencies. At higher frequencies, a pole that is formed by the combination of resistor 104, variable resistor 106 and capacitor 110 introduce a break or pole that flattens the gain of the input amplifier to form a high pass amplifier with a gain controlled by variable resistor 106.

The input amplifier 108, as shown, has a potential gain of 25. The gain must be sufficient to permit the user to adjust the output of the peak detection circuit 120 at output terminal 122 up to a level that is acceptable.

The circuit from the output 109 of input amplifier 108 to the input of peak detector 120 comprises an absolute value circuit that is responsive to the first amplified signal at output 109 for providing an absolute value signal at the absolute value output terminal 114. The peak detection circuit 120, that follows the absolute value circuit, is responsive to the absolute value signal for providing a peaked absolute value signal.

Active filter 116 is a low-pass filter and bias circuit that is responsive to the peak absolute value signal at terminal 122 for providing the control signal to signal line 76. The active filter 116 is also a summing amplifier that allows adjustment of the BIAS ADJ via variable resistor 118 to bring the LED up to an initial brightness or to bring the voltage controlled amplifier into its active range.

On a single channel version of the invention amplifier, the output of active filter 116 is adjusted to a reference point such that when an input signal into the system exceeds a predetermined amplitude level, the filter channel is wide open and the break point of the filter channel is moved out in frequency to its upper limit.

Variable resistor 118 is a dc bias adjustment control for adding a dc bias level to the control signal on signal line 76. The BIAS ADJ adjustment 118 permits the user to control where the filter moves and at what signal level it begins to move. If for example, you had 10 mV of 1000 cycle information as the compensated signal at terminal 22, the user, using the BIAS ADJ control can adjust the filter so that starting at 1000 cycles, and progressing upward in frequency, a 6 dB/octave roll off would be experienced.

If the signal were to increase from 10 mV to 40 mV, then the filter would open up and allow everything from around 20–20K Hz to pass through without being rolled off because the larger amplitude signal would cover or mask the low level noise that is present. Any noise that is in the system would not be audible because it would be masked by the higher level audio in the higher frequency range. As the signal level diminishes, the break frequency of the filter is reduced to attenuate the higher frequencies which is where hiss or noise is first detected by the user.

The above-described embodiments are furnished as illustrative of the principles of the invention, and are not intended to define the only embodiment possible in accordance with our teaching. Rather, the invention is to be considered as encompassing not only the specific embodiments shown, but also any others falling within the scope of the following claims.

I claim:

1. An amplifier circuit comprising:

a state-variable pre-amplifier responsive to a program input signal having high, low and mid-range frequency signal components for providing a compensated signal, the pre-amplifier having gain control circuitry for balancing and summing the high, low and mid-range signal components;

a filter circuit coupled to receive the compensated signal, and a control signal and to provide an output signal, the filter circuit having an adjustable bandwidth, the filter circuit being responsive to the control signal for automatically adjusting the bandwidth of the filter circuit to reduce the bandwidth of the filter circuit in response to reduced amplitude values of the control signal; and an absolute value circuit for providing the control signal proportional to the amplitude of the compensated signal.

2. The amplifier circuit of claim 1 wherein the state variable pre-amplifier further comprises:

a state-variable filter circuit responsive to a program input signal for providing a high frequency compensated signal, a low and mid-range compensated signal components; and a summing amplifier for adding the high frequency compensated signal, low and mid-range compensated signal components to provide the compensated signal.

3. The amplifier circuit of claim 2 wherein the mid-range compensated signal is inverted in phase with respect to the high frequency compensated signal and the low range compensated signal components.

4. The amplifier circuit of claim 1 wherein the filter circuit further comprises:

circuit means responsive to the compensated signal for providing a modified compensated signal, and wherein the absolute value circuit comprises:

a high pass amplifier coupled to receive the modified compensated signal for providing a first amplified signal;

the absolute value circuit being responsive to the first amplified signal for providing an absolute value signal;

a peak detection circuit responsive to the absolute value signal for providing a peaked absolute value signal; and a low-pass filter and bias circuit responsive to the peak absolute value signal for providing the control signal.

5. The absolute value circuit of claim 4 wherein the high pass amplifier further comprises a gain adjustment.

6. The absolute value circuit of claim 4 wherein the low-pass filter and bias circuit further comprises a dc bias adjustment control for adding a dc bias level to the control signal.

7. The amplifier circuit of claim 1 wherein the filter circuit further comprises:

an input amplifier for summing the compensated signal and an integrator output signal to provide a modified compensated signal;

a voltage controlled amplifier having an input responsive to the modified compensated signal and the control voltage for providing an integrator input signal current;

an integrator circuit having an input coupled to receive the integrator input signal current and integrating the integrator input signal to provide an integrator output signal;

a low-pass active filter responsive to the integrator output signal for providing the output signal.

8. The filter circuit of claim 1 wherein the filter circuit further comprises:

an input amplifier for summing the compensated signal and an integrator output signal to provide a modified compensated signal;

a photocell comprising:

a photosensitive resistor and a light emitting diode, the photosensitive resistor being responsive to the light from the light emitting diode for further modifying the modified compensated signal to be an integrator input signal current and for coupling the integrator input signal current to an integrator input, and an integrator circuit having the integrator input coupled to receive the integrator input signal current and integrating the integrator input signal current to provide the integrator output signal;

a low-pass active filter responsive to the integrator output signal for providing the output signal.

9. An amplifier circuit comprising:

a state-variable pre-amplifier responsive to a program input signal having high, low and mid-range frequency signal components, the state-variable pre-amplifier having a state-variable filter circuit and a summing amplifier for providing a compensated signal comprising high, low and mid-range frequency signal components, the state-variable pre-amplifier having means for balancing and summing the high, low and mid-range signal components;

a filter circuit coupled to receive and automatically filter the compensated signal to provide an output signal and a modified compensated signal, the filter circuit having an automatically adjustable bandwidth, the filter circuit being responsive to a control signal for automatically reducing the bandwidth of the filter circuit in response to reduced values of the control signal to obtain the output signal;

the filter circuit comprising:

an input amplifier for summing the compensated signal and an integrator output signal to provide a modified compensated signal;

a photocell having a photosensitive resistor and a light emitting diode, the photosensitive resistor being responsive to the light from the light emitting diode for modifying the modified compensated signal to be an integrator input signal and for coupling the integrator input signal to an integrator input; and the light emitting diode being responsive to the control signal for illuminating the light sensitive resistor, the resistance of the light sensitive resistor being increased in response to lower values of the control signal; and, an absolute value circuit responsive to the modified compensated signal for providing the control signal proportional to the amplitude of the modified compensated signal.

10. The amplifier circuit of claim 9 wherein the state-variable filter for providing a compensated signal further comprises:
   a first amplifier stage responsive to the program signal for providing a high frequency compensated signal;
   a second amplifier stage responsive to an output of the first amplifier for providing a mid-range compensated signal;
   a third amplifier stage for providing a low range compensated signal; and
   a summing amplifier for adding the high frequency compensated signal, the low range compensated signal and the mid-range compensated signal to provide the compensated signal.

11. The state-variable filter circuit of claim 10 wherein the mid-range compensated signal is out of phase with the high frequency compensated signal and the low range compensated signals.

12. The amplifier circuit of claim 10 wherein the absolute value circuit further comprises;
   a high pass amplifier coupled to receive the modified compensated signal for providing an a first amplified signal;
   an active absolute value circuit responsive to the first amplified signal for providing an absolute value signal;
   a peak detection circuit responsive to the absolute value signal for providing a peaked absolute value signal;
   a low-pass filter and bias circuit responsive to the peak absolute value signal for providing the control signal.

13. The absolute value circuit of claim 12 wherein the high pass amplifier further comprises a gain adjustment.

14. The absolute value circuit of claim 12 wherein the low-pass filter and bias circuit further comprises a dc bias adjustment control for adding a dc bias level to the control signal.

15. An amplifier circuit comprising:
   a state-variable pre-amplifier responsive to a program input signal having high, low and mid-range frequency signal components, the state-variable pre-amplifier having
   a state-variable filter for providing a high frequency compensated signal, a low range compensated signal and a mid-range compensated signal, the state-variable filter having;
   a first amplifier stage responsive to the program input signal for providing the high frequency compensated signal;
   a second amplifier stage responsive to the high frequency compensated signal, for providing the mid-range compensated signal; and,
   a third amplifier stage responsive to the mid-range compensated signal for providing the low range compensated signal;
   an adjusting means for adjusting the balance between the high frequency compensated signal, the mid-range compensated signal, and the low range compensated signal; and a summing amplifier for adding the high frequency compensated signal, the low range compensated signal and the mid-range compensated signal to provide a compensated signal; and speaker and amplifier means responsive to the compensated signal for producing an audible sound in response to the compensated signal.

16. The amplifier circuit of claim 15 wherein the mid-range compensated signal components are inverted in phase with respect to the high frequency compensated signal and the low range compensated signal components.

17. The amplifier circuit of claim 15 further comprising:
   a filter circuit coupled to receive the compensated signal, and a control signal and to provide a modified compensated signal, and an output signal, the filter circuit having an adjustable bandwidth, the filter circuit being responsive to the control signal for automatically adjusting the bandwidth of the filter circuit to reduce the bandwidth of the filter circuit in response to reduced amplitude values of the control signal; and,
   an absolute value circuit responsive to the modified compensated signal for providing the control signal having an amplitude proportional to the amplitude of the modified compensated signal.

18. The state-variable pre-amplifier of claim 15 wherein the summing amplifier further comprises:
   a first amplifier stage having an inverting and non-inverting input; the program signal being coupled to the inverting input; and
   a resistor divider network responsive to the mid-range compensated signal, the resistor divider network having an output for providing a portion of the mid-range compensated signal to the first amplifier non-inverting input.

19. The amplifier circuit of claim 15 wherein:
   the state-variable filter first amplifier stage has a first and second inverting and a non-inverting input; the program signal being coupled to a first inverting input, the low range compensated signal being coupled to the second inverting input; and,
   a resistor divider network responsive to the mid-range compensated signal for providing a portion of the mid-range compensated signal to the first amplifier stage non-inverting input;
   the second amplifier stage being an inverting amplifier and having a feedback capacitor;
   the third amplifier stage being an inverting amplifier and having a feed back capacitor; and wherein
   the summing amplifier further comprises:
   means for adjusting the balance between the high frequency compensated signal, the mid-range signal; and the low frequency compensated signal; and,
   a summing circuit for adding the balanced high frequency compensated signal, the low range compensated signal and the mid-range compensated signal to provide the compensated signal.

* * * * *